US006690164B1

(12) United States Patent
Fedeli et al.

(10) Patent No.: US 6,690,164 B1
(45) Date of Patent: Feb. 10, 2004

(54) PERPENDICULAR DETECTION FLUXGATE MICROMAGNETOMETER AND METHOD FOR THE PRODUCTION THEREOF

(75) Inventors: Jean-Marc Fedeli, St Egreve (FR); Robert Cuchet, Grenoble (FR); Denis Duret, Grenoble (FR); Pierre Gaud, Coublevie (FR)

(73) Assignee: Commissariat a l'Energie Atomique, Paris (FR)

( * ) Notice: Subject to any disclaimer, the term of this patent is extended or adjusted under 35 U.S.C. 154(b) by 110 days.

(21) Appl. No.: 09/926,020

(22) PCT Filed: Dec. 14, 2000

(86) PCT No.: PCT/FR00/03521
§ 371 (c)(1),
(2), (4) Date: Oct. 12, 2001

(87) PCT Pub. No.: WO01/44826
PCT Pub. Date: Jun. 21, 2001

(30) Foreign Application Priority Data

Dec. 17, 1999 (FR) .............................................. 99 15961

(51) Int. Cl.⁷ ................................................ G01R 33/04
(52) U.S. Cl. ..................... 324/253; 324/260; 336/200; 336/221
(58) Field of Search .................. 324/239–243, 324/247, 249, 253–255, 260; 33/361; 336/200, 221; 340/870.33

(56) References Cited

U.S. PATENT DOCUMENTS

| 2,321,355 | A | * | 6/1943 | Berman ................... 324/239 X |
| 2,971,151 | A | * | 2/1961 | Mierendorf et al. ..... 324/239 X |
| 4,623,842 | A | | 11/1986 | Bell et al. |
| 5,199,178 | A | | 4/1993 | Tong et al. |
| 5,479,099 | A | * | 12/1995 | Jiles et al. ............... 324/239 X |
| 6,429,651 | B1 | * | 8/2002 | Choi et al. ................... 324/249 |

FOREIGN PATENT DOCUMENTS

GB  721731  1/1955

* cited by examiner

Primary Examiner—Gerard R. Strecker
(74) Attorney, Agent, or Firm—Oblon, Spivak, McClelland, Maier & Neustadt, P.C.

(57) ABSTRACT

A fluxgate micro-magnetometer with perpendicular detection and a process of realization thereof. A ferromagnetic core is perpendicular to a substrate. The axes of excitation coils and pick-up coils are also perpendicular to the substrate. A magnetic field component which is perpendicular to the substrate is thus measured. The two other components can be measured by magnetometers of classical type whose core is parallel to the substrate. Such a device may find application in the domain of magnetic measurement, as an example.

14 Claims, 5 Drawing Sheets

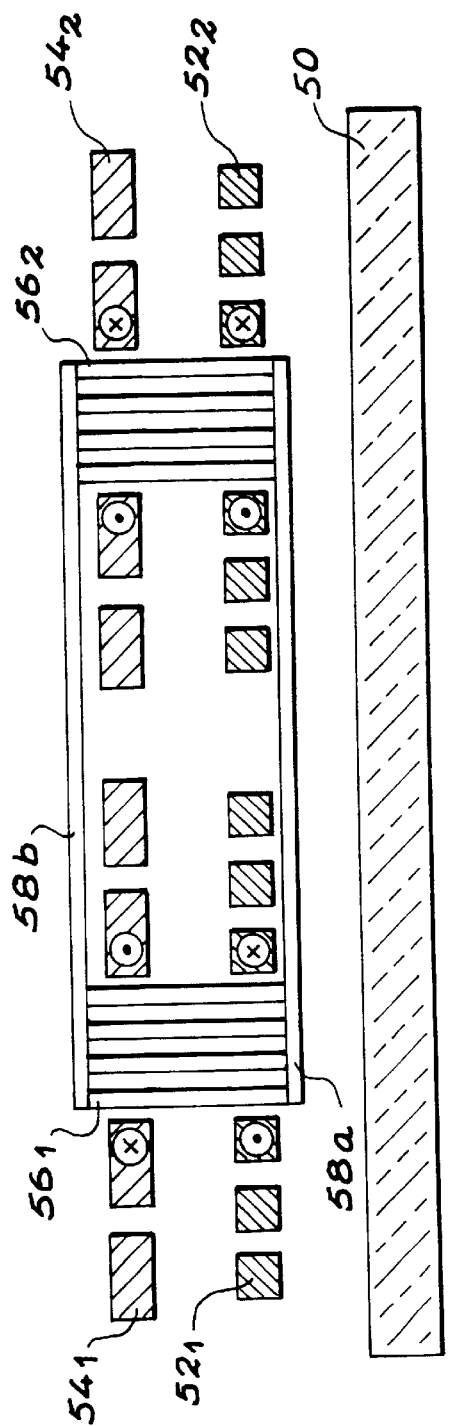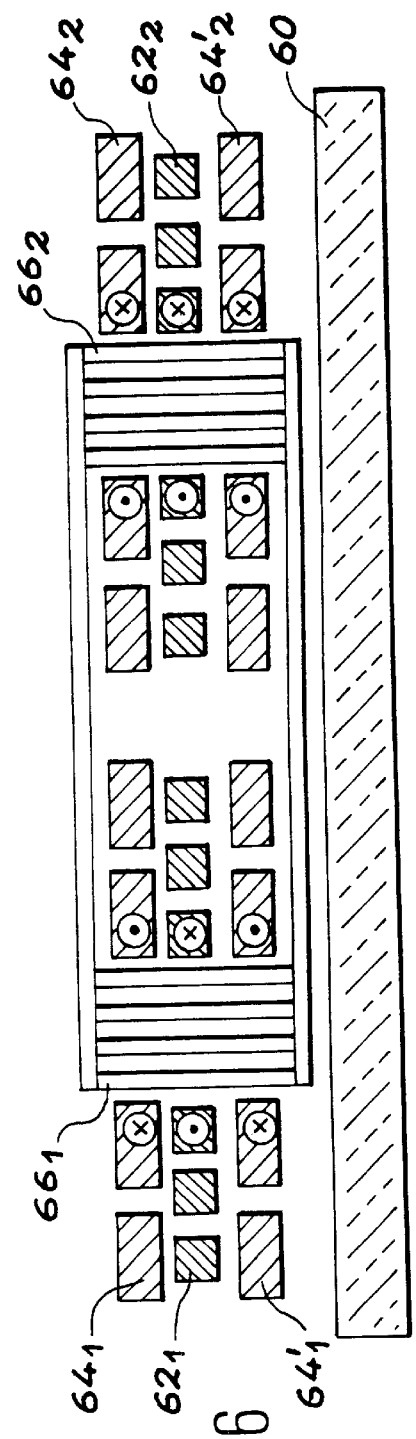
FIG. 5
FIG. 6

PERPENDICULAR DETECTION FLUXGATE MICROMAGNETOMETER AND METHOD FOR THE PRODUCTION THEREOF

TECHNICAL DOMAIN

The present invention relates to a fluxgate magnetometer with perpendicular detection and its process of realisation. This invention applies mainly to the domain of magnetic field measurement and more precisely for:

Localisation and steering of medical instruments

Non-destructive control

Monitoring of aiming system attitude

Navigational aids

Traffic and access control

Magnetic cartography

PRIOR ART

The magnetometers said of fluxgate type (or fluxvalve type) involve the physical properties of saturable ferromagnetic materials. Such a magnetometer usually uses a ferromagnetic core, an excitation coil and a pick-up coil. An alternating current (sine- or triangle-shaped) circulates in the excitation coil and creates a variable magnetic field, that is a variable induction in the core. As soon as the saturation of the material is reached, its permittivity decreases strongly. A supplementary field which should be applied would not lead to any significant increase of induction, as if the "gate" offered to the magnetic flux was closed. Conversely, when the current in the excitation core crosses zero, the permittivity of the material is high and the gate is open to the flux, hence the "fluxgate" expression.

The variable induction in the core then creates a variable magnetic flux in the detection coil, which provokes an electric signal on the terminals of the said coil. The existence of an external magnetic field creates a distortion of this signal from which the external field value can be derived. The development of the micro-technology in the magnetic measurement domain led to the realisation of micromagnetometers, said of "microfluxgate" type.

In particular, through the use of electrolytic deposits, it is possible to obtain magnetic layers and coils with layered conductors whose dimensions are very small. One finds a description of these fluxgate micro-magnetometers in the following articles:

Microfluxgate magnetic sensing elements using closely-coupled excitation and pick-up coils" from Shoji KAWAHITO et al. in "Transducers 95-Eurosensors"IX 290-A12;

A miniaturised magnetic field sensor system consisting of a planar fluxgate sensor and a CMOS readout circuitry from R. GOTTFRIED-GOTTFRIED et al. in "Sensors and Actuators" A 54 (1996), pp. 443–447;

"High-resolution microfluxgate sensing elements using closely coupled coil structure" from Shoji KAWAHITO et al. in "Sensors and Actuators" A 54 (1996) pp. 612–617:

A microfluxgate magnetic sensor using micromachined 3-Dimensional planar coils" from Trifon M. Liakopoulos et al. in "Solid State Sensor and Actuator Workshop", June 98.

Figure 1A:
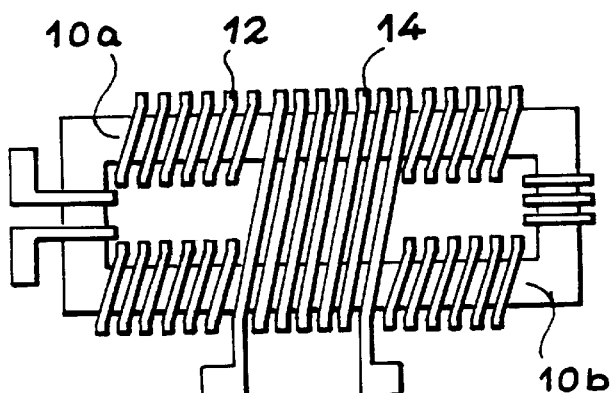
Figure 1B:
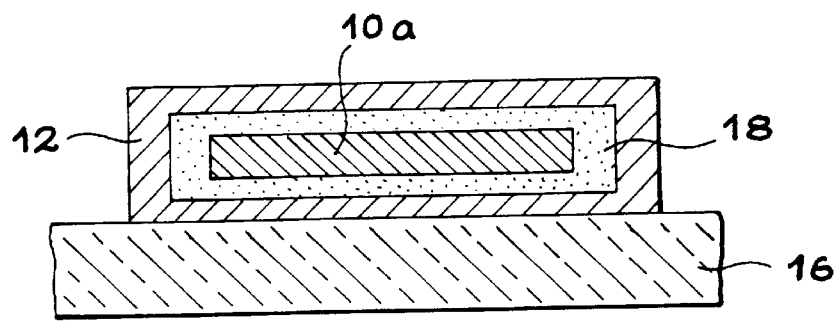

The FIGS. 1A and 1B show a top view and a cross section of a fluxgate magnetometer of current type. It is composed of two ferromagnetic bars 10a and 10b, a double excitation coil 12 and a pick-up coil 14. The whole is realised on a non-magnetic substrate 16, for example a silicon substrate. The cross-section—FIG. 1B—is drawn along a plane containing one of the strips of the coil 12. Insulating material 18 is provided as shown in FIG. 1B.

In the case of this arrangement, the pick-up coil 14 sees no global flux, as the induced fields in the bars 10a and 10b are of opposite signs. When submitted to an external field, the equilibrium is broken and the signal picked-up at coil 14 terminals reveals this external field. More precisely, this signal reveals the component of the field which is parallel to the substrate 16, and, moreover, parallel to the longitudinal axis of the bars 10a and 10b.

For some applications, it is necessary to know the amplitude and direction of the measured field, which requires to measure three components of the field along three orthogonal directions. The magnetometers of current type are sensitive to the component of the field which is parallel to the substrate and consequently permit the measurement along two orthogonal directions X and Y, provided that two identical micro-magnetometers are available on the same substrate, whose orientations are orthogonal (respectively X and Y). With two identical micro-magnetometers orientated along Y and Z, the field components along Y and Z will be obtained. Thus, with three micro-magnetometer orientated along X, Y and Z, the three components of the field can be measured. Usually, the two magnetometers are located on two adjacent faces of a cube. The precision of the measurement is altered due to defects on the cube machining (faces are not perfectly perpendicular) or a bad position of the magnetometers resulting from poor bonding process etc.

The purpose of the present invention is to overcome these drawbacks.

DESCRIPTION OF THE INVENTION

To that effect, the invention proposes a micro-magnetometer sensitive to the field component which is perpendicular to the substrate (and not to the one which is parallel to the said substrate), i.e. orientated along the Z axis if the X and Y axes are parallel to the substrate. Hence, the measurement of the three components of a given field can be derived by combining the use of the micro-magnetometer object of the invention, which delivers the component along Z, with the use of two classical micro-magnetometers located on the same substrate and delivering the components along X and Y.

Precisely, the object of the present invention is a fluxgate magnetometer featuring a substrate which includes at least one ferromagnetic core fitted with at least one excitation coil and one pick-up coil, this core and these coils having the same axis, this magnetometer being characterised by the fact that the said axis is perpendicular to the substrate.

The object of the present invention is also to disclose the realisation method of the said micro-magnetometer, characterised by the following steps:

one uses a non magnetic substrate whose one part at least is an insulating material;

one creates in the insulating material two conducting coils surrounding a central area;

one etches this central area to create a an imprint whose axis is perpendicular to the substrate;

one fills up this imprint with a ferromagnetic material.

Figure 2:
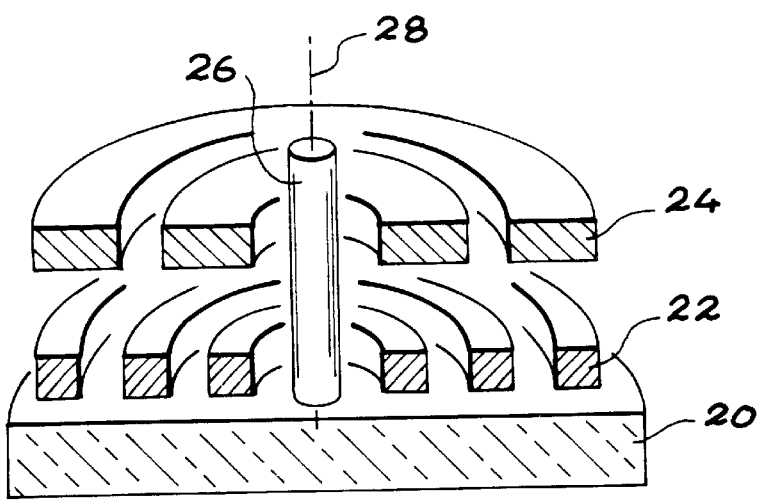
Figure 3B:
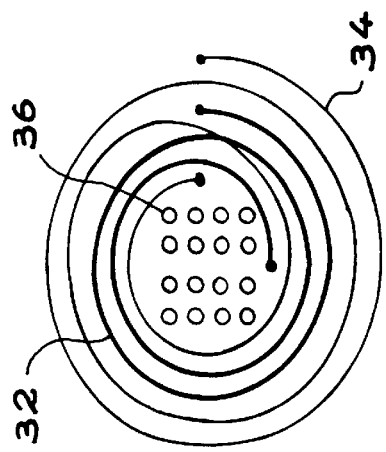
Figure 3A:
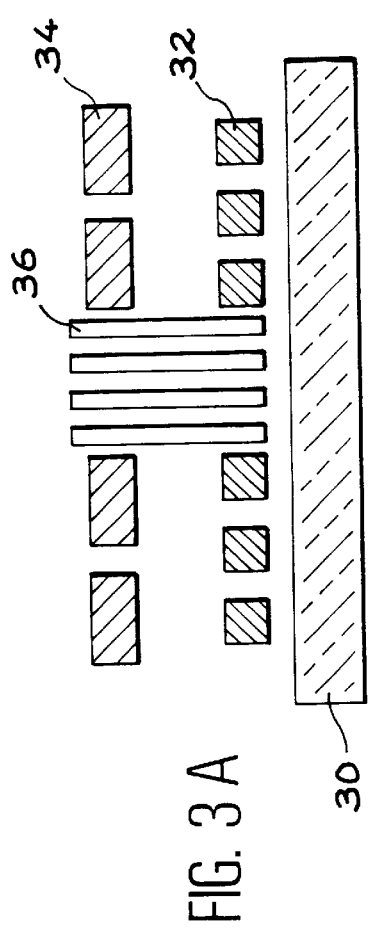
Figure 4:
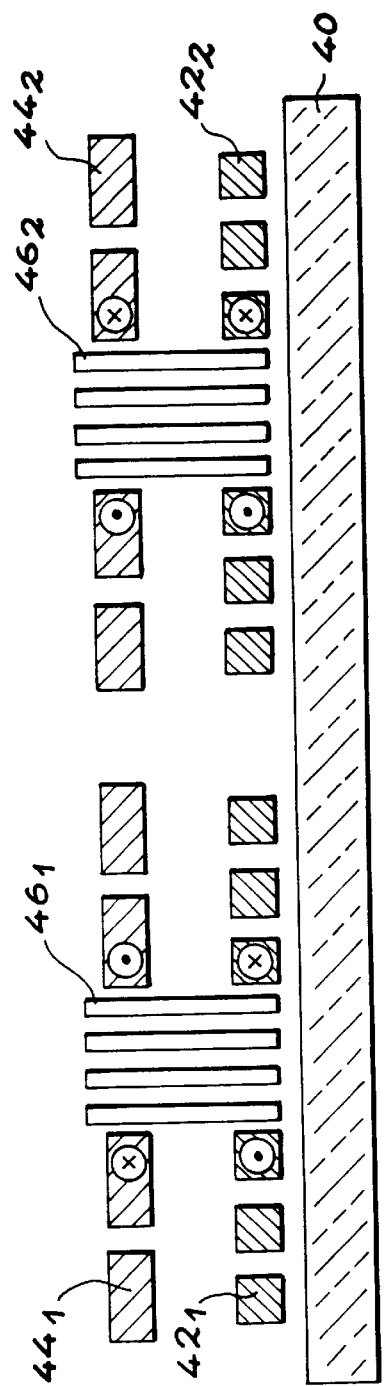
Figure 7:
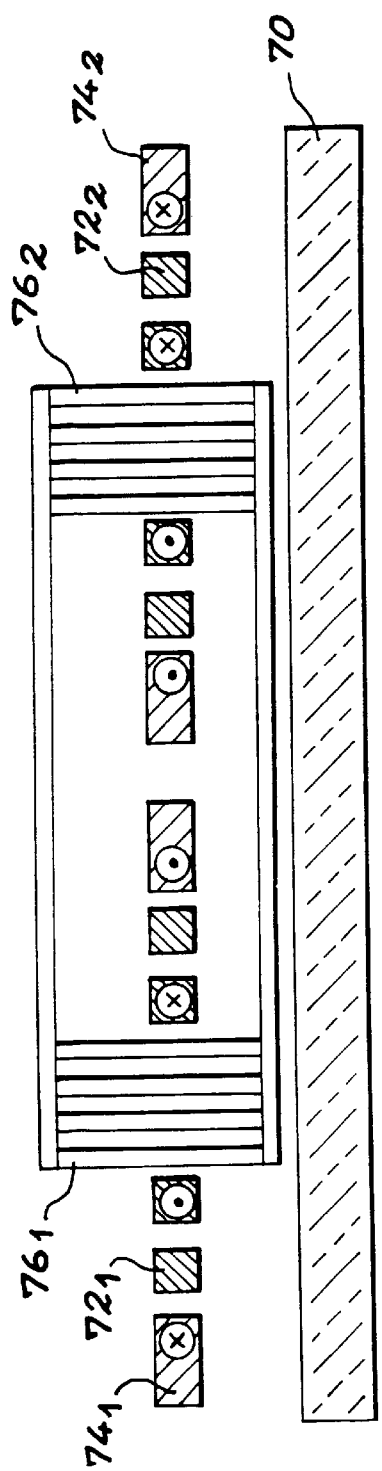
Figure 8:
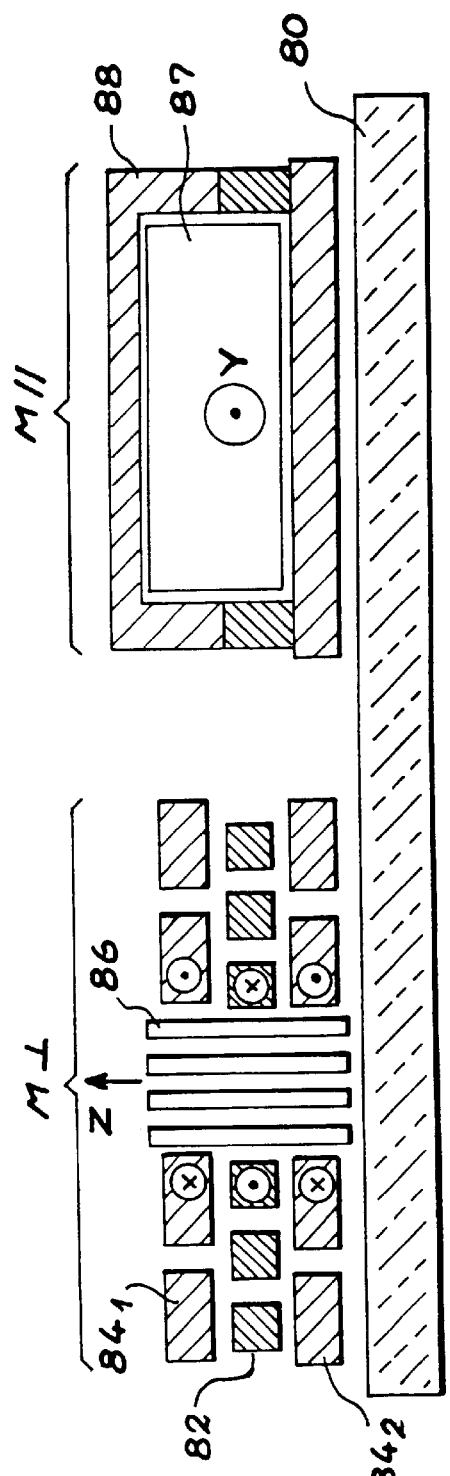

SHORT DESCRIPTION OF THE DRAWINGS the already described FIGS. 1A and 1B, show a fluxgate micro-magnetometer following the current art;

the FIG. 2 shows a magnetometer according to the invention realised in a way where the core is made up of one magnetic part only;

the FIGS. 3A and 3B show a micro-magnetometer realised in a way where the core is made up of needles;

the FIG. 4 details a differentially set double micro-magnetometer;

the FIG. 5 illustrates a version with a closed magnetic circuit;

the FIG. 6 explains a realisation process leading to a double excitation coil;

the FIG. 7 presents a realisation process where the two coils are located in a same plane;

the FIG. 8 details a micro-magnetometer intended for measuring two perpendicular components of a magnetic filed.

Figure 9:
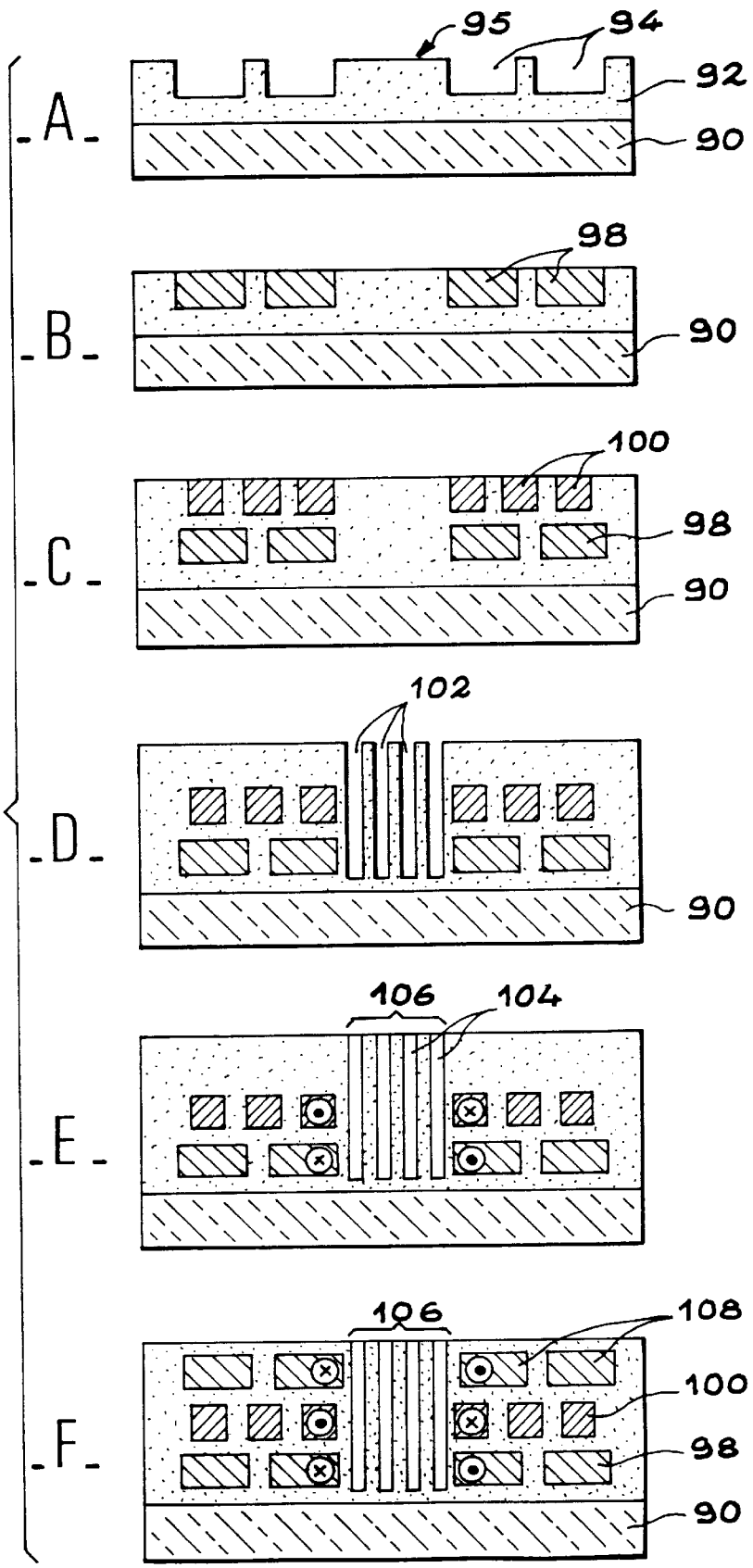

FIG. 9 illustrates a process to realise a micro-magnetometer following the invention.

DETAILED DISCLOSURE OF SOME PARTICULAR PROCESSES OF REALISATION

The FIG. 2 relates to a simple design: the ferromagnetic core is made up of a single bar. One sees a substrate 20, for example silicon, a pick-up coil 22, an excitation coil 24 (both in copper, for example) and a ferromagnetic core 26 (FeNi for example). The coils 22 and 24, as well as the core 26 have the same axis, referenced 28, which is perpendicular to the substrate 20.

The shape of bar 26 cross-section may be of any kind: square, rectangular, circular, ovoid, etc. The shape of coils can also be of any kind: circular, square, spiral, etc. the point being that these coils surround at least partly the core. The cross-section of these coils can be square or rectangular or anything else. The pick-up coil is not necessarily located under the excitation coil, as shown on the picture, the inverse situation being possible.

The FIGS. 3A and 3B detail a micro-magnetometer whose core is not made up of a single bar, but involves several ferromagnetic needles. The FIG. 3A is a cross section whereas the FIG. 3B is a schematic top view thereof. A substrate 30 is fitted with a pick-up coil 32 and an excitation coil 34, the core 36 being assumed to be made up of 16 needles arranged in a square pattern (this number and pattern of course are only an example). This pattern proves of interest, when compared with the previous one, as it permits to reduce, on a given magnetic material thickness, the effect of degaussing fields liable to become too important at some thickness values.

The FIG. 4 details, on a same substrate 40, a first pick-up coil $42_1$ and a first excitation coil $44_1$, surrounding one first magnetic core $46_1$, as well as a second pick-up coil $42_2$ and a second excitation coil $44_2$ surrounding a second ferromagnetic core $46_2$ located in the vicinity of the first one. The first said coils $42_1$, $44_1$, and the said second coils $42_2$, $44_2$, are connected in opposition. This means that the set up is such as the magnetic fluxes $F_1$ and $F_2$ in cores $46_1$ and $46_2$ are of opposite sign. The circles marked with a cross and a dot show the direction of currents circulating through the conductors (towards the back of the sheet for the cross and towards the front for the dot). This arrangement thus operates in differential mode.

The FIG. 5 shows a structure which involves a substrate 50, two pick-up coils $52_1$ and $52_2$, two excitation coils $54_1$ and $54_2$, as well as two cores $56_1$ and $56_2$. It is also fitted with two magnetic arms 58a and 58b, parallel to the substrate 50 and linking together the two cores $56_1$ and $56_2$. All the magnetic parts thus compose a closed circuit.

To improve the excitation, a second level of excitation may be added, as shown on FIG. 6, which details a substrate 60, a pick-up coil $62_1$, $62_2$, a double excitation coil $64_1$, $64_1'$, $64_2'$, $64_2'$. The pick-up coil is located on an intermediate level, between the two levels of the double excitation coil. The whole assembly is here again connected in differential mode.

The excitation and pick-up coils are not necessarily located on different levels; they can be placed on the same level, as shown on the FIG. 7. This arrangement features a substrate 70, a pick-up coil $72_1$, $72_2$, an excitation coil $74_1$, $74_2$ and two cores $76_1$, $76_2$. The pick-up coil winding $72_1$, $72_2$, is interleaved with the excitation coil winding, all windings being in the same plane. The whole assembly is connected in differential mode.

The FIG. 8 shows a composite micro-magnetometer including a first micro-magnetometer $M_\perp$ according to the invention, and a second micro-magnetometer $M_{//}$ following the prior art. These two micro-magnetometer share the same substrate 80. The micro-magnetometer $M\perp$ has a pick-up coil 82 and a double excitation coil $84_1$, $84_2$, as well as a ferromagnetic core 86. This device then measures the field component along a direction perpendicular to the substrate 80 (Z arrow). The second magnetometer $M_{//}$ comprises a ferromagnetic core 87 and excitation and pick-up coils 88 (only one turn of the winding appears on the cross section), the core and the coils having a common axis parallel to the substrate (as on the FIG. 1B). This second micro-magnetometer $M_{//}$ measures the component of the field along a direction parallel to the substrate (Y arrow perpendicular to the plane of the sheet).

A third micro-magnetometer identical to the second one but orientated along a direction X perpendicular to Y and Z can be placed on the same substrate 80 so as to obtain a system which proves sensitive to the three components of any field.

The FIG. 9, to conclude, illustrates a process to realise a micro-magnetometer following the invention. This figure refers to the particular case of a core made up of a number of needles with a double excitation coil, but, of course, the process disclosed in the invention is not restricted to this particular case.

Using a non magnetic substrate 90, for example silicon, one creates a layer 92 of insulating material, for example silica obtained by thermal oxidisation. One could also use a glass substrate. In the latter case, it is not necessary to deposit an insulating layer. One creates in this insulating material, for example via a photo-lithographic plus etching process, an imprint 94 which has the shape of the required coil and surrounds the central area 95 where shall be located the ferromagnetic core (part A).

Preferably by electrolytic growth of a conducting material (for example copper), one fills the imprint to obtain a coil 98 (part B).

One iterates these operations (a new insulating layer, etching of a imprint, electrolytic deposit) to obtain a second coil 100 (part C). Another insulating layer is then deposited anew.

On the central area 95, holes 102 are etched for inserting afterwards core needles (part D). Preferably by electrolytic growth of a ferromagnetic material (FeNi for example), the holes 102 are filled up and one obtains the core 104 in area 106 (part E).

By means of further photo-lithographic operations, etching and electro-deposit, one obtains a coil 108 (part F) that is then insulated.

The coil 100 is used as a pick-up coil, whereas the coils 98 and 108 are used as a double excitation coil.

What is claimed is:

1. Fluxgate micro-magnetometer comprising:
   a substrate configured to support the micro-magnetometer;
   at least one ferromagnetic core mounted substantially perpendicular to said substrate; at least one planar excitation coil supported by said substrate; and
   at least one planar pick-up coil supported by said substrate, said core and coils having a same axis that is defined by said core and, is substantially perpendicular to the substrate.

2. Micro-magnetometer according to claim 1, wherein the core is made up of a single bar.

3. Micro-magnetometer according to claim 1, wherein the core is made up of a number of needles.

4. Micro-magnetometer according to claim 1, comprising, on the substrate, one first ferromagnetic core surrounded by a first excitation coil, and one first pick-up coil, and a second ferromagnetic core located close to the first ferromagnetic core, surrounded by a second excitation coil and a second pick-up coil, said second coil and said first coil being connected in differential mode.

5. Micro-magnetometer according to claim 4, further comprising two magnetic arms parallel to the substrate which are linking the first and the second ferromagnetic cores, the arms-cores assembly forming a closed magnetic circuit.

6. Micro-magnetometer according to claim 1, wherein the excitation coil and the pick-up coil are located on different levels with respect to the substrate.

7. Micro-magnetometer according to claim 1, wherein the excitation coil and the pick-up coil are located on a same level with respect to the substrate.

8. Micro-magnetometer according to claim 6, wherein the excitation coil is double and occupies two superimposed levels, the pick-up coil being located on a intermediate level between the two levels occupied by the double excitation coil.

9. Micro-magnetometer comprising a first micro-magnetometer according to claim 1, and, on the same substrate, a second micro-magnetometer having an axis which is parallel to the substrate.

10. Micro-magnetometer according to claim 9, further comprising a third micro-magnetometer having an axis which is parallel to the substrate and perpendicular to the axis of the second magnetometer.

11. Process for realising a micro-magnetometer according to claim 1,
    using a non-magnetic substrate, having at least one portion, which is made up of an insulating material;
    creating on the insulating material two conducting coils surrounding a central area;
    etching the central area to obtain an imprint whose axis is perpendicular to the substrate; and
    filling up the imprint with a ferromagnetic material.

12. Process according to claim 11, wherein, to obtain the imprint, a number of holes are etched in the insulating part, perpendicularly to the substrate.

13. Process according to claim 11, wherein the imprint etched in the central area is filled up by electrolytic growth of a ferromagnetic material.

14. Process according to claim 11, wherein, for obtaining a conducting coil, an imprint is formed in the insulating material, by photo-lithography and etching, said imprint having a shape of the required coil and surrounding the central area, and then the imprint is filled up with a conductive material.

* * * * *